(12) United States Patent
Imai

(10) Patent No.: US 7,791,966 B2
(45) Date of Patent: Sep. 7, 2010

(54) APPARATUS, MEMORY DEVICE AND METHOD OF IMPROVING REDUNDANCY

(75) Inventor: Kazuyuki Imai, Tokyo (JP)

(73) Assignee: NEC Corporation, Tokyo (JP)

( * ) Notice: Subject to any disclaimer, the term of this patent is extended or adjusted under 35 U.S.C. 154(b) by 109 days.

(21) Appl. No.: 12/292,258

(22) Filed: Nov. 14, 2008

(65) Prior Publication Data
US 2009/0135660 A1    May 28, 2009

(30) Foreign Application Priority Data
Nov. 26, 2007   (JP) .............................. 2007-304269

(51) Int. Cl.
G11C 29/00    (2006.01)
G11C 7/06    (2006.01)
(52) U.S. Cl. ............... 365/200; 365/189.02; 365/189.07
(58) Field of Classification Search .................. 365/200
See application file for complete search history.

(56) References Cited

U.S. PATENT DOCUMENTS 6,668,345 B1 *  12/2003  Ooishi et al. ................. 714/710
6,757,852 B1 *   6/2004  Ghassemi et al. ........... 714/711

FOREIGN PATENT DOCUMENTS

JP    11-25690    1/1999

* cited by examiner

Primary Examiner—Son L Mai
(74) Attorney, Agent, or Firm—McGinn IP Law Group, PLLC

(57) ABSTRACT

An apparatus includes a memory device. The memory device includes a first memory cell column which includes a plurality of first memory cells, a second memory cell column including a plurality of second memory cells, a detector which detects a delay of a memory cell signal outputted from at least one of the first memory cells, and a selector which selects the second memory cell column instead of the first memory cell column when the delay exceeds a predetermined criteria.

23 Claims, 14 Drawing Sheets

US 7,791,966 B2

APPARATUS, MEMORY DEVICE AND METHOD OF IMPROVING REDUNDANCY

INCORPORATION BY REFERENCE

This application is based upon and claims the benefit of priority from Japanese patent application No. 2007-304269, filed on Nov. 26, 2007, the disclosure of which is incorporated herein in its entirety by reference.

BACKGROUND OF THE INVENTION

1. Field of the Invention

The present invention relates to an apparatus, a memory device and a method of improving redundancy.

2. Description of Related Art

With miniaturization of a semiconductor fabricating process, the number of defects of a memory device which are caused during the fabrication (e.g., dust particles) is increasing. The defects gradually deteriorate use of the device, until the memory device finally becomes inoperative.

Recently, the period when the defects occur, i.e., an initial failure period of a "bathtub curve", is increasing. Therefore, an accelerated test and the like for screening the initial failures are performed.

However, it is difficult to estimate a duration of performing the accelerated test, and thus it is difficult to completely remove all of the initial failures of the memory device.

Patent Document 1 discloses that a one-bit error of the RAM is recovered by using an ECC (Error Checking and Correcting) code.

In Patent Document 1, a redundant bit for collecting the one-bit error is added to the RAM, and a circuit for the ECC is added to a system to which the RAM is installed.

[Patent Document 1] Japanese Patent Laid-Open No. 11-25690

SUMMARY OF THE INVENTION

According to one exemplary aspect of the present invention, an apparatus includes a memory device, the memory device including a first memory cell column which includes a plurality of first memory cells, a second memory cell column including a plurality of second memory cells, a detector which detects a delay of a memory cell signal outputted from at least one of the first memory cells, and a selector which selects the second memory cell column instead of the first memory cell column when the delay exceeds a predetermined criteria.

According to another exemplary aspect of the present invention, a memory device includes a first memory cell column which includes a plurality of first memory cells, a second memory cell column including a plurality of second memory cells, a detector which detects a delay of a memory cell signal outputted from at least one of the first memory cells, and a selector which selects the second memory cell column instead of the first memory cell column when the delay exceeds a predetermined criteria.

According to another exemplary aspect of the present invention, a method of controlling a memory device, includes detecting a delay of a memory cell signal which is outputted from at least one of a plurality of first memory cells of a first memory cell column, and selecting a second memory cell column which includes a plurality of second memory cells instead of the first memory cell column when the delay exceeds a predetermined criteria.

BRIEF DESCRIPTION OF THE DRAWINGS

Other exemplary aspects and advantages of the invention will be made more apparent by the following detailed description and the accompanying drawings, wherein.

DETAILED DESCRIPTION OF THE EXEMPLARY EMBODIMENTS

According to Patent Document 1, a defective DRAM may be relieved by the ECC, and thus there may be no need to repair the defective DRAM. Therefore, costs for repairing may be reduced. However, in a DRAM having a one-bit error caused during a fabrication may include a higher possibility of having a multi-bit error. According to Patent Document 1, the multi-bit error cannot be recovered.

Therefore, in Patent Document 1, a reliability for overcoming the defect during the fabrication is not sufficient.

1. First Exemplary Embodiment

Figure 1:
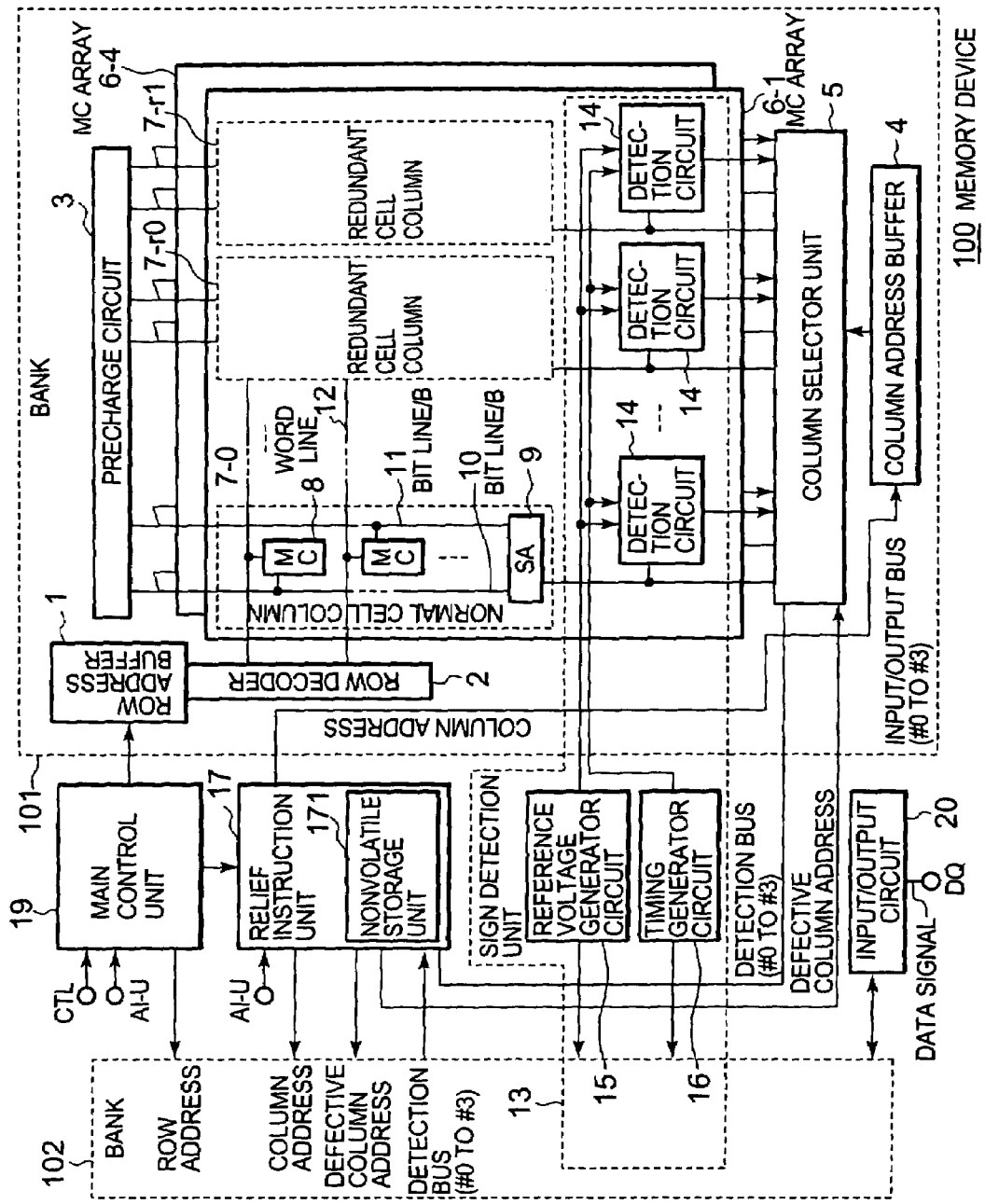
FIG. 1 is an exemplary block diagram of the present invention.

FIG. 1 is an exemplary block diagram of a first exemplary embodiment.

A memory device 100 may be configured with four bits*four mega-words*two banks, for example. In the first exemplary embodiment, the two banks are referred to as a bank 101 and a bank 102. In the first exemplary embodiment, the bank 101 and 102 are configured similarly, for example.

The bank 101 includes a row address buffer 1, a row decoder 2, a precharge circuit 3, a column address buffer 4, a column selector unit 5, and MC (memory cell) arrays 6-1 to 6-4.

Each of the MC arrays 6-1 to 6-4 may include 1K numbers of normal cell columns 7-0 each of which includes, for example, 4K numbers of MCs 8, a bit line pair (e.g., a bit line B 10 and a bit line /B 11) which are connected to the MCs 8, and SA (sense amplifier) 9 which is connected to the bit line pairs.

The bit line B 10 may be connected to MCs 8 which are arranged along even-numbered words lines (word #0, #2, . . . , #4094), for example. The bit line B 10 may be connected to one terminal, hereinafter called a "True side", of SA 9. The bit line /B 11 may be connected to MCs 8 which are arranged along odd-numbered word lines (word #1, #3, . . . ,

4095), for example. The bit line /B 11 may be connected to one terminal, hereinafter called a "Complement side", of SA 9.

Each of the MC arrays 6-1 to 6-4 may include redundant cell columns 7-r0 and 7-r1, respectively. The number of the redundant cell columns is not limited to two. The SA 9 amplifies the level (voltage) between the bit line B 10 and the bit line /B 11 of the bit line pairs.

A detection circuit 14 is connected to the SA 9.

All of the bit line pairs (B 10 and /B 11 and others) of the MC array 6-1 are connected to an input/output bus pair (#0) via a column selector unit 5. All of the bit line pairs of the MC array 6-2 are connected to an input/output bus pair (#1) via a column selector unit 5. All of the bit line pairs of the MC array 6-3 are connected to an input/output bus pair (#2) via a column selector unit 5. All of the bit line pairs of the MC array 6-4 are connected to an input/output bus pair (#3) via a column selector unit 5. The cell columns, SA 9, detection circuits 14 and so on which are included in each of the MC arrays 6-1 to 6-4 are grouped as a bit GRP #0 to #3, respectively.

The detection circuit 14 verifies a voltage level and a timing when the output of the SA 9 is changed, detects a sign of a failure, and holds a detection result by a latch or the like. The SA 9 is, for example, a latch-type sense amplifier, and a signal is inputted/outputted to the bit line pairs B 10 or /B 11 through the SA 9.

The column selector unit 5 outputs an output of the SA 9 of a column corresponding to a column address stored in the column address buffer 4 to the input/output bus pairs (#0 to #3). When the column address matches a defective column address, the column selector unit 5 selects an output of the SA 9 corresponding to the redundant cell column 7-r0. The column selector unit 5 selects an output of the detection circuit 14 of the column corresponding to a column address of the column address buffer 4 in response to a detection selection instruction.

When the column address matches the defective column address, the column selector unit 5 selects an output of the detection circuit 14 corresponding to the redundant cell column 7-r0. The column selector unit 5 sends the output of the selected detection circuit 14 to a relief instruction unit 17 via a detection bus (#0 to #3).

The relief instruction unit 17 collects an output of the detection circuit 14 through the column selector unit 5. The relief instruction unit 17 allocates the redundant cell columns 7-r0 or 7-r1 to the cell column in which the sign of failure is detected. The relief instruction unit 17 creates a defective column address information. The relief instruction unit 17 stores the defective column address information in a nonvolatile storage unit 171.

The relief instruction unit 17 reads out the defective column address information from the nonvolatile storage unit 171 during an initialization of the memory device 100, and instructs the column selector unit 5 to replace the cell column showing the sign of failure with the redundant cell columns 7-r0 or 7-r1 for preventing a further defect. The relief instruction unit 17 receives a signal of "AI-L", which corresponds to a lower bit of an address inputted from outside of the memory device, and makes the signal of "AI-L" into the column address. The column address buffer 4 may be a buffer latch which holds a column address sent from the relief instruction unit 17.

A reference voltage generator circuit 15 supplies a reference voltage (Vref) to the detection circuit 14, and the reference voltage is compared with a voltage level of the output of the SA 9. The timing generator circuit 16 outputs a first timing (Φ1, in FIG. 3) for sampling the compared result between the voltage level of the output of the SA 9 and the reference voltage, and outputs a second timing (Φ2, in FIG. 3) which is delayed by a time shorter than the first timing.

A main control unit 19 controls a normal read/write operation in response to an external CTL signal (e.g., CE, RAS, CAS, WE, TEST) and a signal of "AI-U" (upper portion of the external input address).

The main control unit 19 includes a refresh timer and a refresh address counter (neither shown in FIG. 1). The main control unit 19 also includes a self-refresh function to alternately refresh the bank 101 and the bank 102.

An input/output circuit 20 inputs and outputs DQ (a data signal) and connects the DQ to any one of the input/output buses (#0 to #3).

Figure 2:
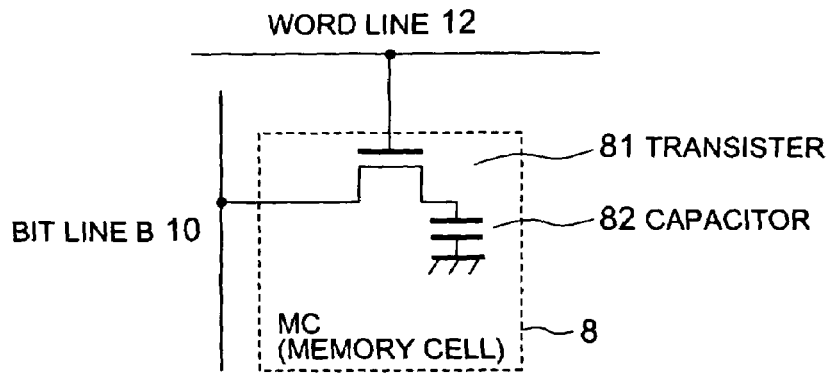
FIG. 2 is an exemplary block diagram of a memory cell.

FIG. 2 shows an exemplary configuration of the MC 8. The MC 8 includes a transistor 81 and a capacitor 82. A gate of the transistor 81 is connected to a word line 12. The transistor 81 is also connected to the bit line B 10 or the bit line /B 11.

Figure 4:
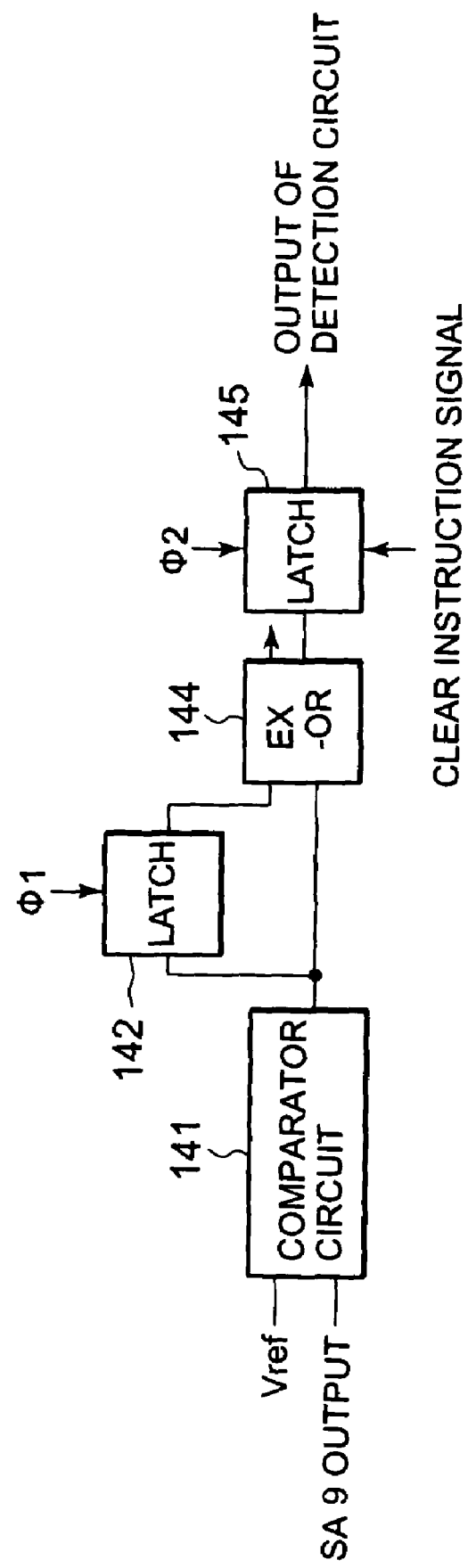
FIG. 4 is an exemplary block diagram of a detection circuit.

FIG. 4 is a drawing showing an exemplary configuration of the detection circuit 14. The detection circuit 14 includes a comparator circuit 141, a latch 142, an EX-OR element 144 (EXCLUSIVE-OR element), and a latch 145. The comparator circuit 141 compares the levels between the reference voltage (Vref) and the SA 9 output (an output of the bit line B 10 or /B 11), converts the result to a binary value (i.e., "1" or "0"), and outputs the binary value.

An output of the compared result between the voltage level of the output of the SA 9 and the reference voltage is latched at the first timing (Φ1) by the latch 142. An exclusive-ORed result of an output of the latch 142 and the output of the comparator circuit 141 is latched by the latch 145 at the second timing (Φ2) which occurs at a short time after the first timing.

In other words, the latch 145 is set when the compared result between the voltage level of the SA 9 and the reference voltage is different between that at the first timing and that at the second timing. Once "1" is set, the latch 145 holds the "1" state until the latch 145 receives a clear instruction signal.

An exemplary principle of the detection circuit 14 to detect the delay of a change (e.g., rising edge) of an SA 9 output (output of the bit line B 10 or the bit line /B 11) will be described.

Figure 3:
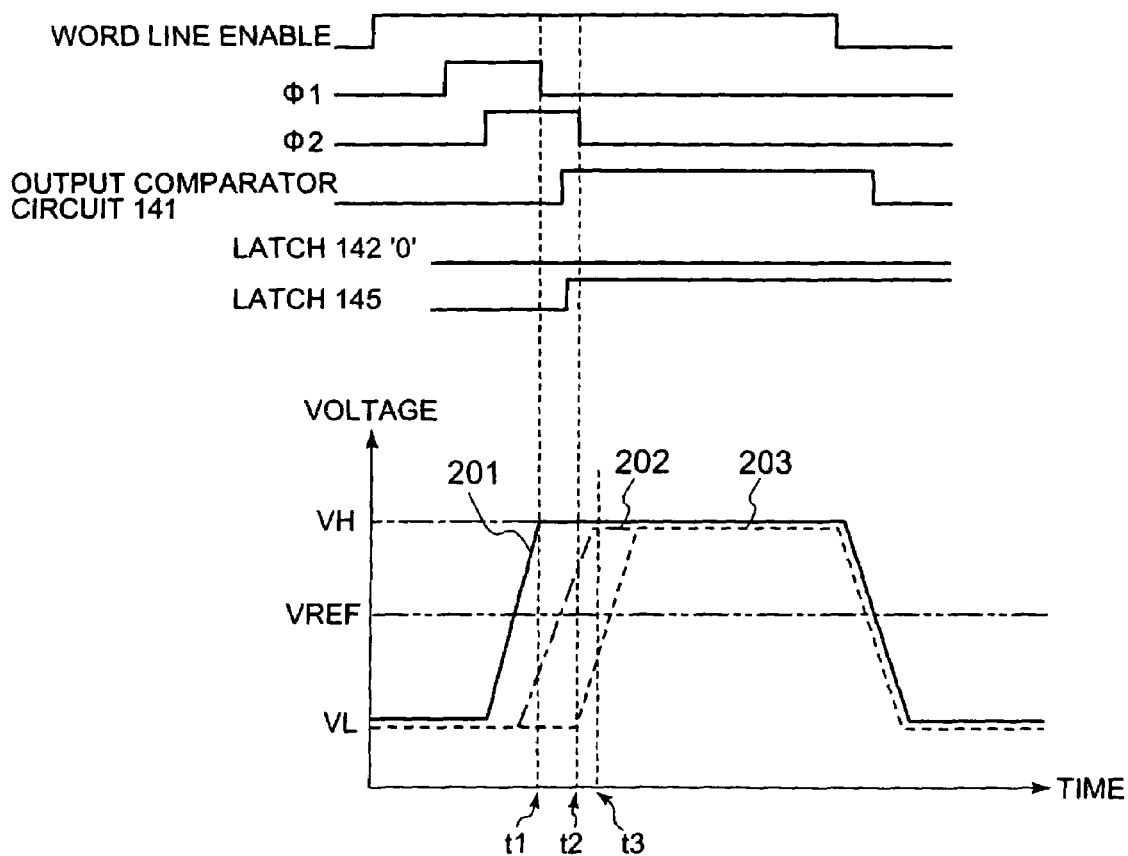
FIG. 3 is an exemplary timing chart.

FIG. 3 shows a bit line voltage 201 indicating that the memory cell column is normal, a bit line voltage 202 indicating that the memory cell column is abnormal, and a bit line voltage 203 indicating that the memory cell column is in failure, as well as the timings of the sign detection unit 13.

The bit line voltage 203 indicates that the memory cell column is in failure due to the delay of the output of the SA 9 (e.g., the delay being caused by dust particles during the fabrication and so on). The bit line voltage 202 indicates that the memory cell is not in failure, but the memory cell shows the sign of failure due to a slight delay of the output of the SA 9 (e.g., the slight delay being still within the margin). The slight delay is smaller than the delay of the bit line voltage 203.

Timing "t1" (shown in FIG. 3) is a timing of comparing at the comparator circuit 141. If an amplification of the signal of MC 8 by the SA 9 has been finished within the "t1", then it means that the memory cell column is in normal condition. In other words, "t1" indicates that the amplification should be finished by time "t1" as a design requirement. "t1" corresponds to the first timing (Φ1) which is generated by the timing pulse generator circuit 161.

If the amplification has not been finished within a timing "t3" (shown in FIG. 3), then it means that the memory cell column is in a failure condition. The voltage level of the bit line is latched again at a timing of "t2" after the voltage is latched at the timing of "t1". The timing "t2" is slightly delayed rather than "t1". Timing "t2" may be within the timing "t3". In other words, the timing "t2" may be shorter than the timing The timing "t2" means a time for detecting a sign of failure. The timing "t2" corresponds to the second timing ($\Phi$2). The timing "t2" is adjusted by a variable delay circuit 162 when the variable delay circuit 162 receives a delay setting command including a delay value. A value of the timing "t2" depends on an operation condition or an unevenness in quality of the memory device. The adjustment of the timing "t2" may be done according to the operation condition or the unevenness in quality.

The adjusted delay value is written in the nonvolatile storage unit 171 by a first control write command. The adjusted delay value is read from the nonvolatile storage unit 171 at an initialization of the memory device, and then the "t2" is set.

The EX-OR element 144 determines whether a value of the output of the comparator circuit 141 at the first timing ($\Phi$1) does not match a value of the output of the comparator circuit 141 at the second timing ($\Phi$2), and the result of the determination is latched by the latch circuit 145. If the value at the first timing ($\Phi$1) is the same as the value at the second timing ($\Phi$2), then it means that the memory cell column is in the normal condition. If the value at the first timing ($\Phi$1) is different from the value at the second timing ($\Phi$2), then it means that the memory cell column shows a sign of failure.

Figure 5:
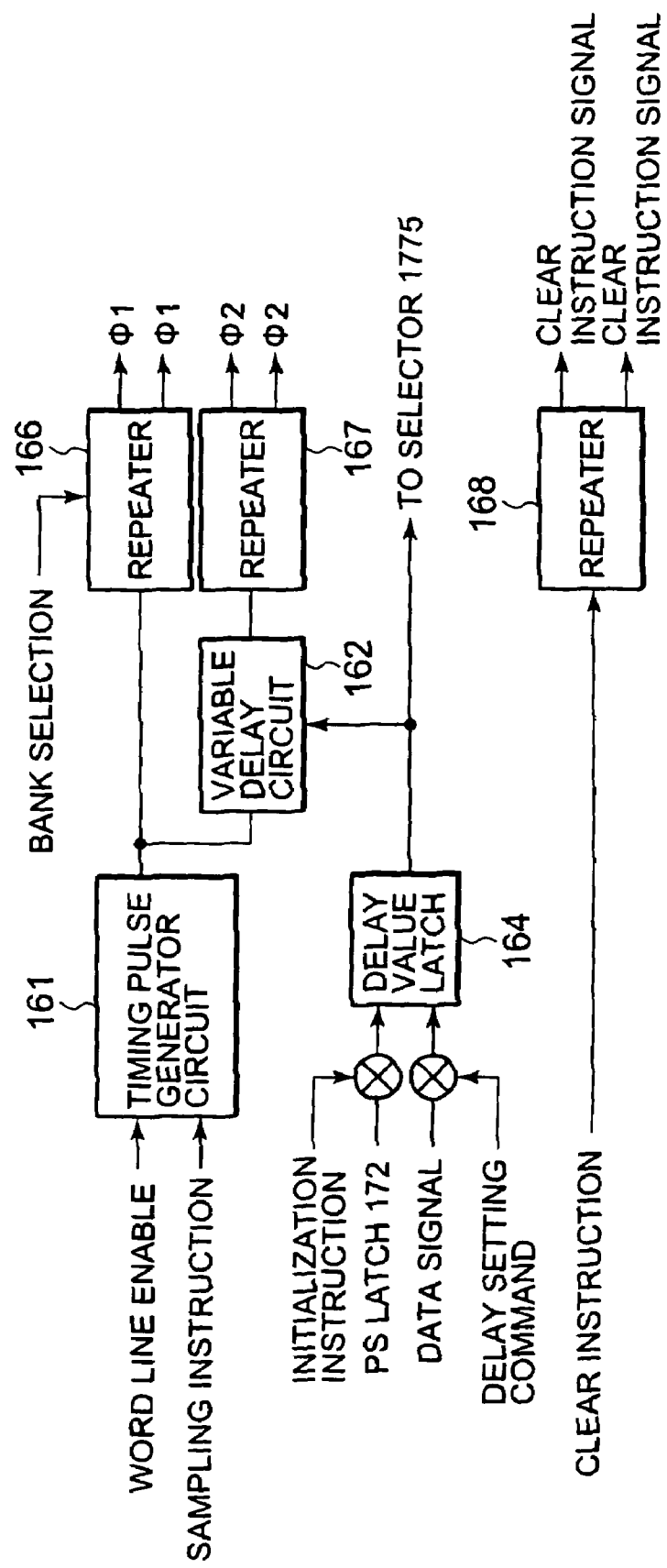
FIG. 5 is an exemplary block diagram of a timing generator circuit.

FIG. 5 shows an exemplary configuration of the timing generator circuit 16. The timing generator circuit 16 includes a timing pulse generator circuit 161, a variable delay circuit 162, a delay value latch 164, and repeaters 166 to 168.

When the timing pulse generator circuit 161 receives a word line enable pulse while the sampling instruction is "ON", the timing pulse generator circuit 161 outputs a first timing pulse. Then, the second timing pulse is generated by adding the delay value stored in the nonvolatile storage unit 171 to the first timing pulse. The repeaters 166 to 168 are selective repeaters which output only the outputs specified by a bank selection.

The word line enable pulse is a pulse of activating a row selection signal output of the row decoder 2 and driving the corresponding word line 12 at read, write, and refresh of the memory device.

The delay value latch 164 receives (e.g., is set with) the delay value from a PS latch 172 and a data signal upon receiving an initialization instruction and a delay setting command. When the relief instruction unit 17 receives the first control write command, the relief instruction unit 17 sends the delay value which is set in the delay value latch 164 to a selector 1775, and writes the delay value to the nonvolatile storage unit 171 via the PS latch 172.

When the repeater 168 receives a clear instruction from the relief instruction unit 17 at the initialization of the memory device, the repeater 168 sends the clear instruction signal to the latch 145, and the value which is set in the latch 145 is cleared.

Next, an exemplary operation timing of the sign detection unit 13 is described.

When the main control unit 19 starts refreshing, the word line enable pulse is outputted to the timing pulse generator circuit 161. The timing pulse generator circuit 161 outputs the first timing pulse. The first timing pulse is delayed by a predetermined time from the rising edge of the word line enable pulse. Then, the timing pulse generator circuit 161 outputs the second timing pulse which is generated by adding the delay value stored in the nonvolatile storage unit 171 to the first timing pulse.

In FIG. 3, during the period when the first timing pulse is "1", the output of the comparator circuit 141 is "0". The first timing pulse falls at the "t1" timing, and "0" is latched to the latch 142. Next, the output of the comparator circuit 141 rises, the output of the EX-OR element 144 becomes "0".

The latch circuit 145 gets the output of the EX-OR element 144, and then at the timing of falling edge of the second timing pulse, the latch circuit 145 holds the output of the EX-OR element 144.

Figure 6:
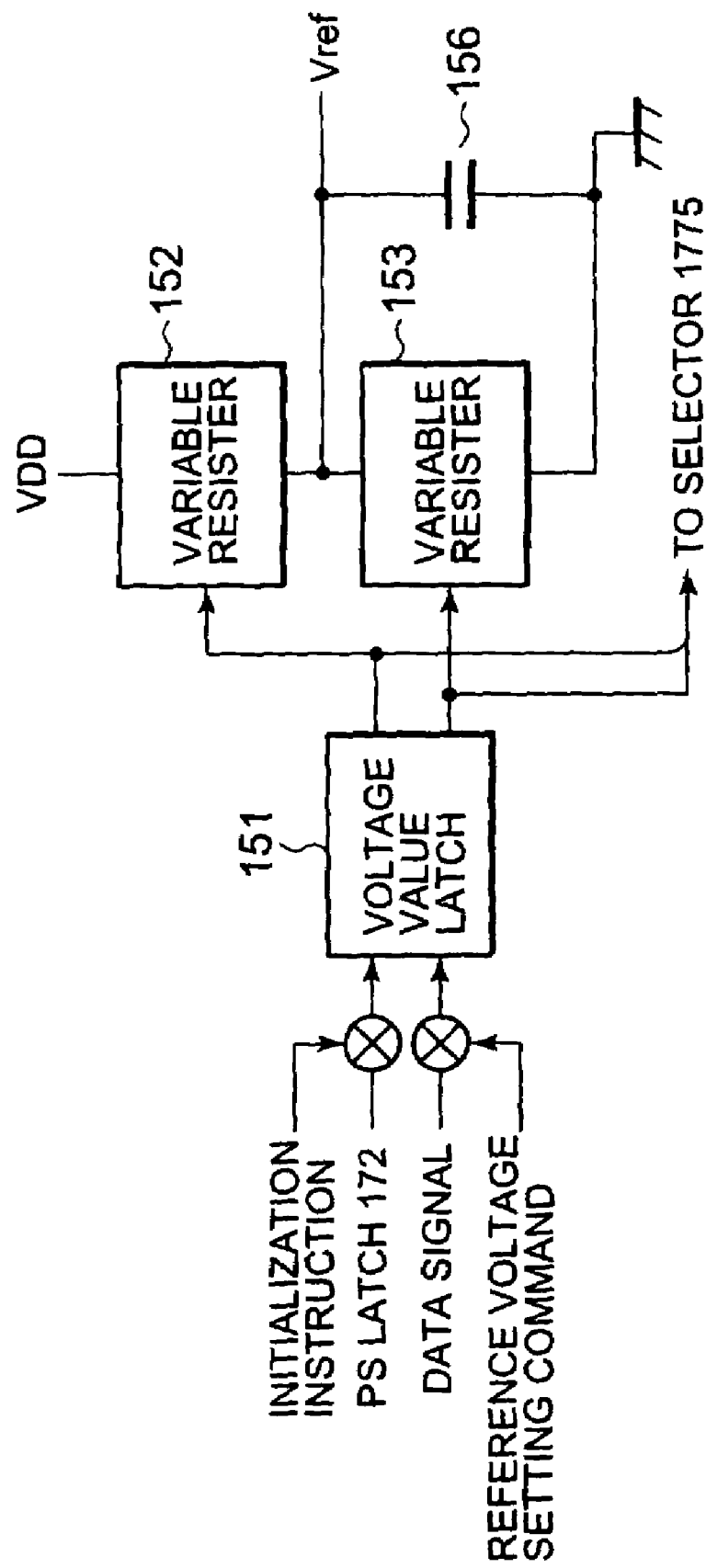
FIG. 6 is an exemplary block diagram of a reference voltage generator circuit.

FIG. 6 shows an exemplary configuration of the reference voltage generator circuit 15. The reference voltage generator circuit 15 includes variable resistors 152 and 153, a capacitor 156, and a voltage value latch 151.

The variable resistors 152 and 153 divide a VDD into a reference voltage (Vref). A voltage value is set to the voltage value latch 151 from the PS latch 172 and the data signal according to the initialization instruction and a reference voltage setting command.

When the relief instruction unit 17 receives a second control write command, the relief instruction unit 17 sends the voltage value stored in the voltage value latch 151 to the selector 1775, and then the voltage value is written to the nonvolatile storage unit 171 via the PS latch 172.

Figure 7:
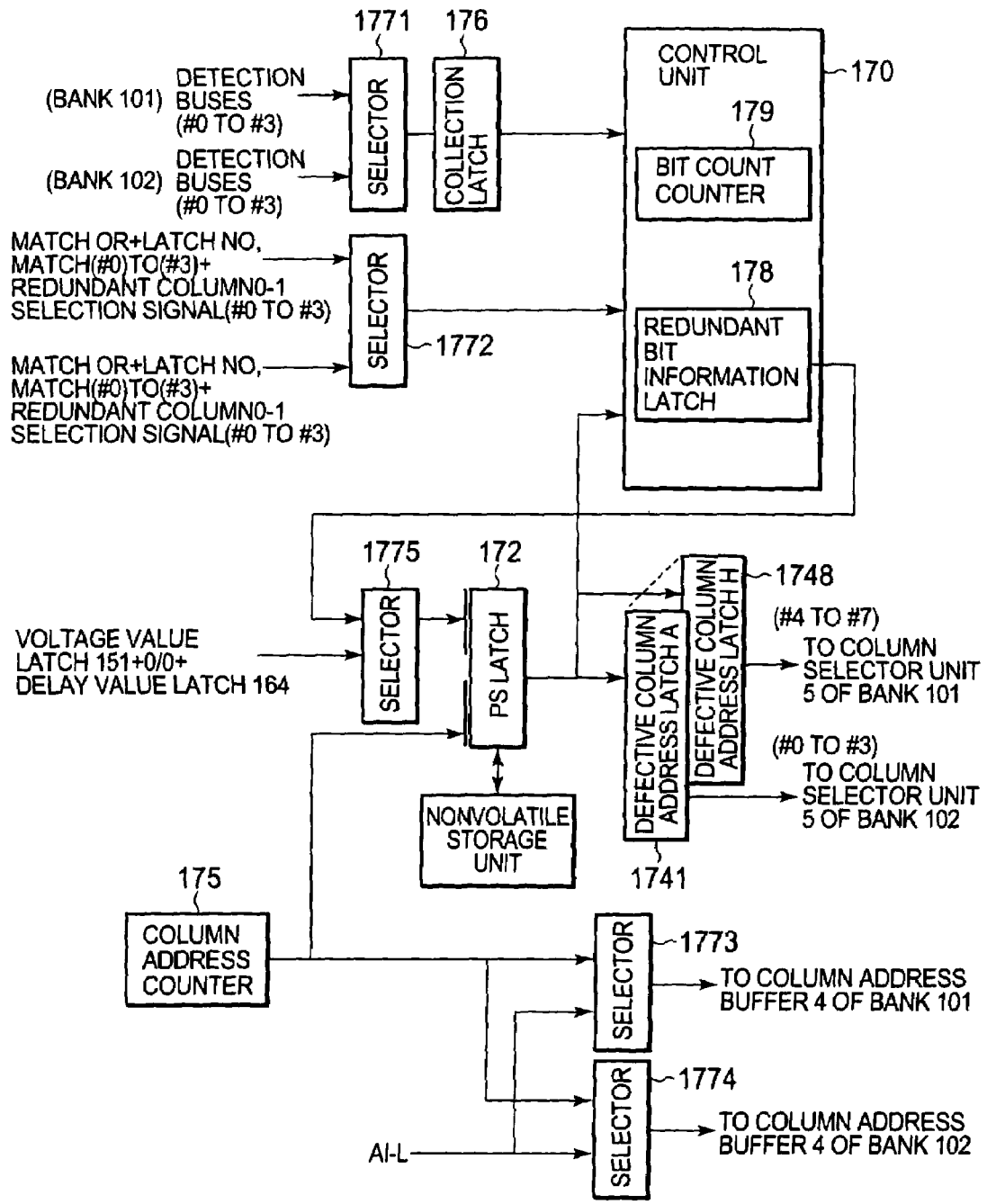
FIG. 7 is an exemplary block diagram of a relief instruction unit.

FIG. 7 is an exemplary block diagram of the relief instruction unit 17. The relief instruction unit 17 includes the nonvolatile storage unit 171, the PS latch 172, the defective column address latch A 1741 to the defective column address latch H 1748, the column address counter 175, the collection latch 176, selectors 1771 to 1775, and the control unit 170 which controls these elements of the relief instruction unit 17.

The nonvolatile storage unit 171 is, for example, a 1-bit-serial one-time ROM. The PS latch 172 is an input/output latch of the nonvolatile storage unit 171 and a shift latch which performs a parallel-to-serial conversion at input, and performs a serial-to-parallel conversion at output.

Each of the defective column address latch A 1741 to the defective column address latch H 1748 holds the defective column address information. The four outputs of the defective column address latches of the defective column address latch A 1741 to the defective column address latch D 1744 are sent to the column selector unit 5 of the bank 101.

The four outputs of the defective column address latches of the defective column address latch E 1745 to the defective column address latch H 1748 are sent to the column selector unit 5 of the bank 102.

The column address counter 175 is an up-counter of column addressed (e.g., 10 bits) which is incremented from 0 to 1023, for example.

The selectors 1773 and 1774 select any one of the output of the column address counter 175 and the "AI-L", which corresponds to a lower bit of an address inputted from outside of the memory device, and send the selected one to the corresponding column address buffer 4 of the bank 101 and the bank 102, respectively.

When the control unit 170 collects the output of the detection circuit 14 of the bank 101, the control unit 170 instructs the selector 1773 to select the output of the column address counter 175.

Figure 9:
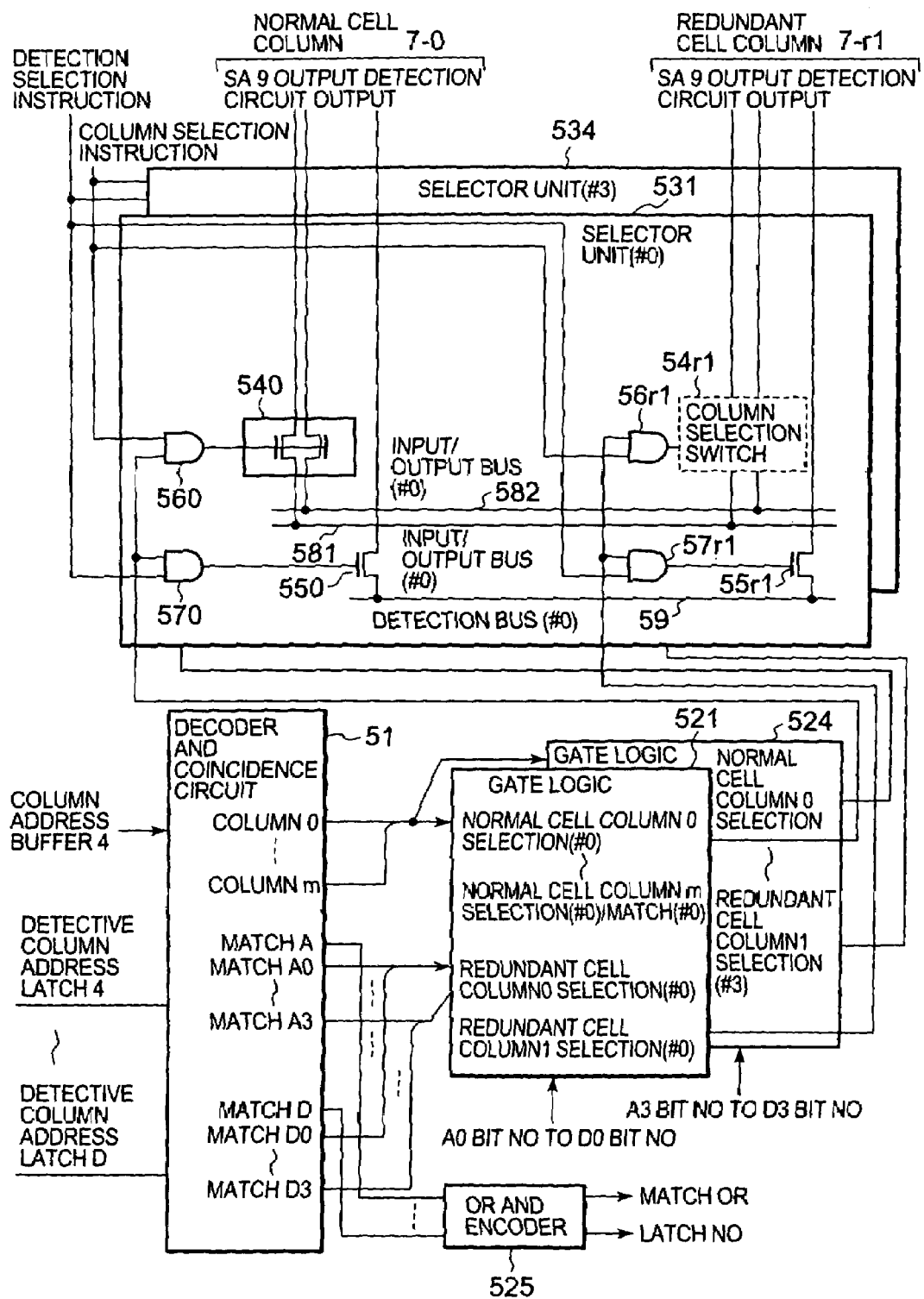
FIG. 9 is an exemplary block diagram of a column selector unit.

The selector 1771 switches between a value of the bank 101 and a value of the bank 102 for the detection buses (#0 to #3) which are shown in FIG. 9. The selector 1772 switches between a value of the bank 101 and a value of the bank 102 for a match OR+latch No, a match (#0) to (#3)+a redundant cell column 0-1 selection signal (#0 to #3). The match OR, the latch No, the match (#0) to (#3), and the redundant cell column 0-1 selection signal (#0 to #3) are described in detail later.

The "+" denotes a concatenation (concatenation of bit strings).

The selector 1775 selects write data from the control unit 170. The selector 1775 selects the concatenation of the output of the voltage value latch 151 and "0", or the concatenation of the output of the delay value latch 164 and "0" when the control unit 170 receives the second control write command.

The collection latch 176 is a 4-bit latch which holds the values of the detection buses (#0 to #3) 59, which is shown in FIG. 9, of the bank selected by the selector 1771, for example.

The control unit 170 instructs the sign detection unit 13 to perform sampling of the result of detection of the sign of failure, collects the detected output of the detection circuit 14, determines the validity of the sign of failure at detection, generates defective column address information as relief information, and writes the information in the nonvolatile storage unit 171.

In response to an initialization signal such as "power-on", the control unit 170 reads the nonvolatile storage unit 171. The control unit 170 sets the voltage value and the delay value to the voltage value latch 151 and the delay value latch 164, respectively. The control unit 170 sets the defective column address information to the defective column address latch A 1741 to the defective column address latch H 1748. The control unit 170 instructs a switching from the cell column exhibiting the sign of failure to the redundant cell column.

When the initialization signal (e.g., power-on) and a refresh start signal for each bank are received from the main control unit 19, the control unit 170 detects the period allowed to perform a process of sampling, a process of collecting the result of detection of the sign of failure, a process of generating defective column address information, and a process of writing in the nonvolatile storage unit 171, and controls the corresponding elements to perform the corresponding process.

The process of sampling is performed during the initialization of the memory device 100, during the bank, which is a target of the sampling, is being refreshed, or during the bank which is the target of the sampling is being accessed. The process of collecting the result of detection of the sign of failure and the process of generating and writing the defective column address information are performed during the initialization of the memory device 100, or during the bank which is not target of the process of collecting or the process of generating and writing the defective column address information is being refreshed.

The redundant bit information latch 178 in the control unit 170 holds the state of the redundant cell column of 8 bits per bank. For example, the bit corresponding to an allocated or defective redundant cell column is set to "1".

Figure 8:
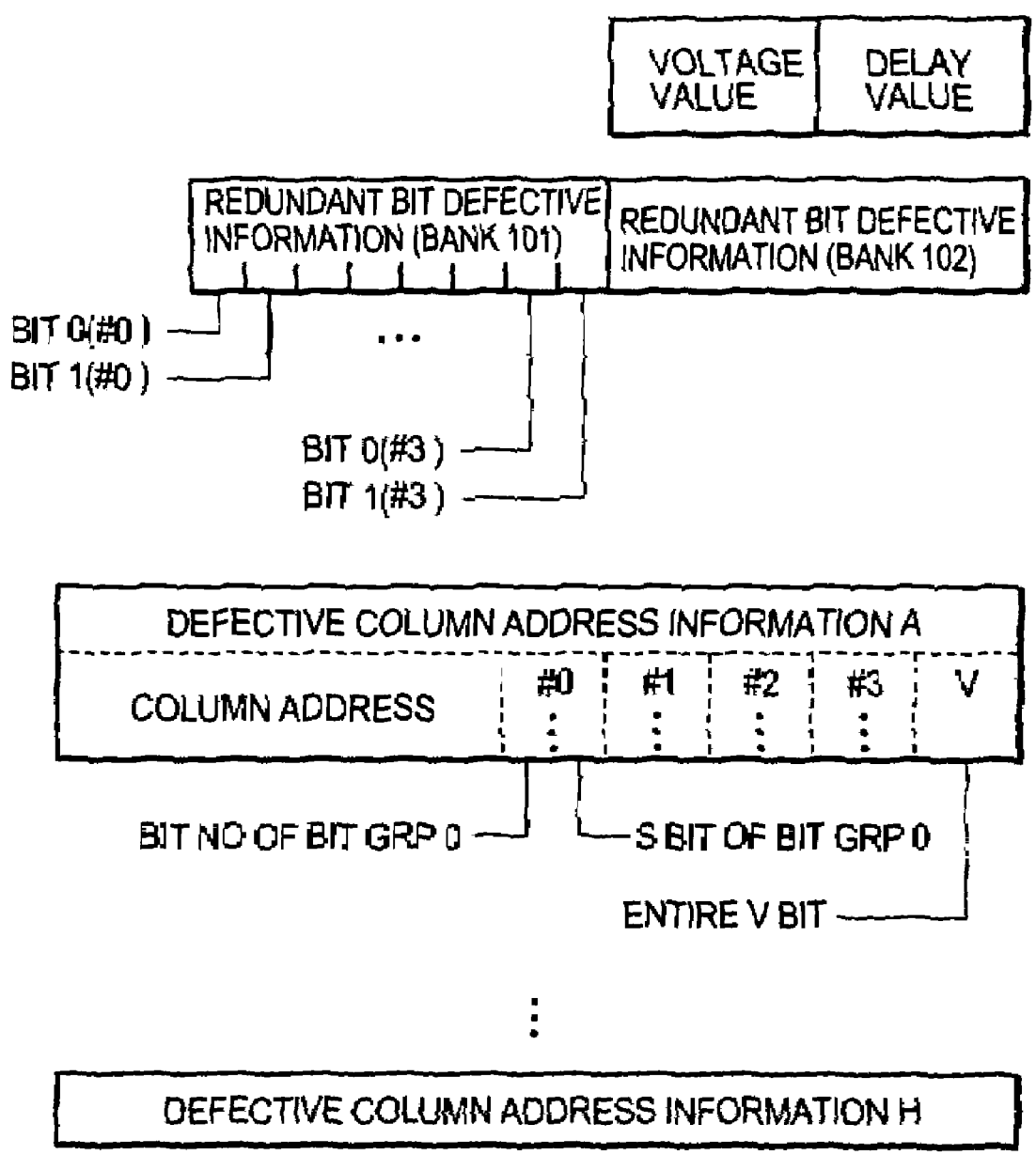
FIG. 8 shows exemplary contents stored in a nonvolatile storage unit.

FIG. 8 shows exemplary contents stored in the nonvolatile storage unit 171. The voltage value, the delay value, the redundant bit defective information, and the defective column address information A to H are stored in the nonvolatile storage unit 171.

The redundant bit defective information may be configured by an 8-bit binary value for the bank 101 and the bank 102, respectively. The redundant bit defective information of the respective bank starts with a redundant bit 0 of the bit GRP #0 and ends with a redundant bit 1 of the bit GRP #3. If the redundant bit is set to "1", then the bit GRP corresponding to the redundant bit which is set to "1" is prohibited from being used.

Each of the defective column address information A to H may include a column address configured by 10-bits, an S bit (switching instruction bit) of each of the bit GRPs, a bit No. (number) of each of the bit GRPs and an entire V bit (validity flag) of each of the bit GRPs.

The column address indicates the column address which shows the sign of failure and is to be switched with the redundant cell column. When the S bit of each of the bit GRPs is "1", it means that the corresponding bit GRP includes the cell column which shows the sign of failure and is to be switched with the redundant cell column. The bit No of each of the bit GRPs indicates the identification number of the redundant cell column to be replaced instead of the cell column which shows the sign of failure.

FIG. 9 shows an exemplary configuration of the column selector unit 5. The column selector unit 5 includes selector units 531 to 534, a decoder and coincidence circuit 51, gate logics 521 to 524 and an OR and encoder 525. The selector unit 531 is for the bit GRP #0. The selector unit 531 includes an input/output bus (#0) 581 and an /input/output bus (#0) 582, column selection switches 540 to 54r1, and AND elements 560 to 56r1 for controlling the gates for the input/output bus (#0) 581 and an /input/output bus (#0).

The column selection switches 540 to 54r1 may be 1026 switches (transistor pair) corresponding to 1K numbers of the cell columns and two redundant cell columns. The column selection switches 540 to 54r1 switches the bit line B 10 and the bit line /B 11 of each of cell columns to the input/output bus (#0) 581 and the /input/output bus (#0) 582, respectively.

The selector unit 531 includes the detection bus (#0) 591 for controlling the output of the detection circuit 14, column selection transistors 550 to 55r1, and 1026 numbers of AND elements 570 to 57r1 for controlling the gates for the detection bus (#0).

The column selection signal is common to the selection of the bit line B 10 and the selection of the output of the detection circuit, in the first exemplary embodiment.

Figure 14:
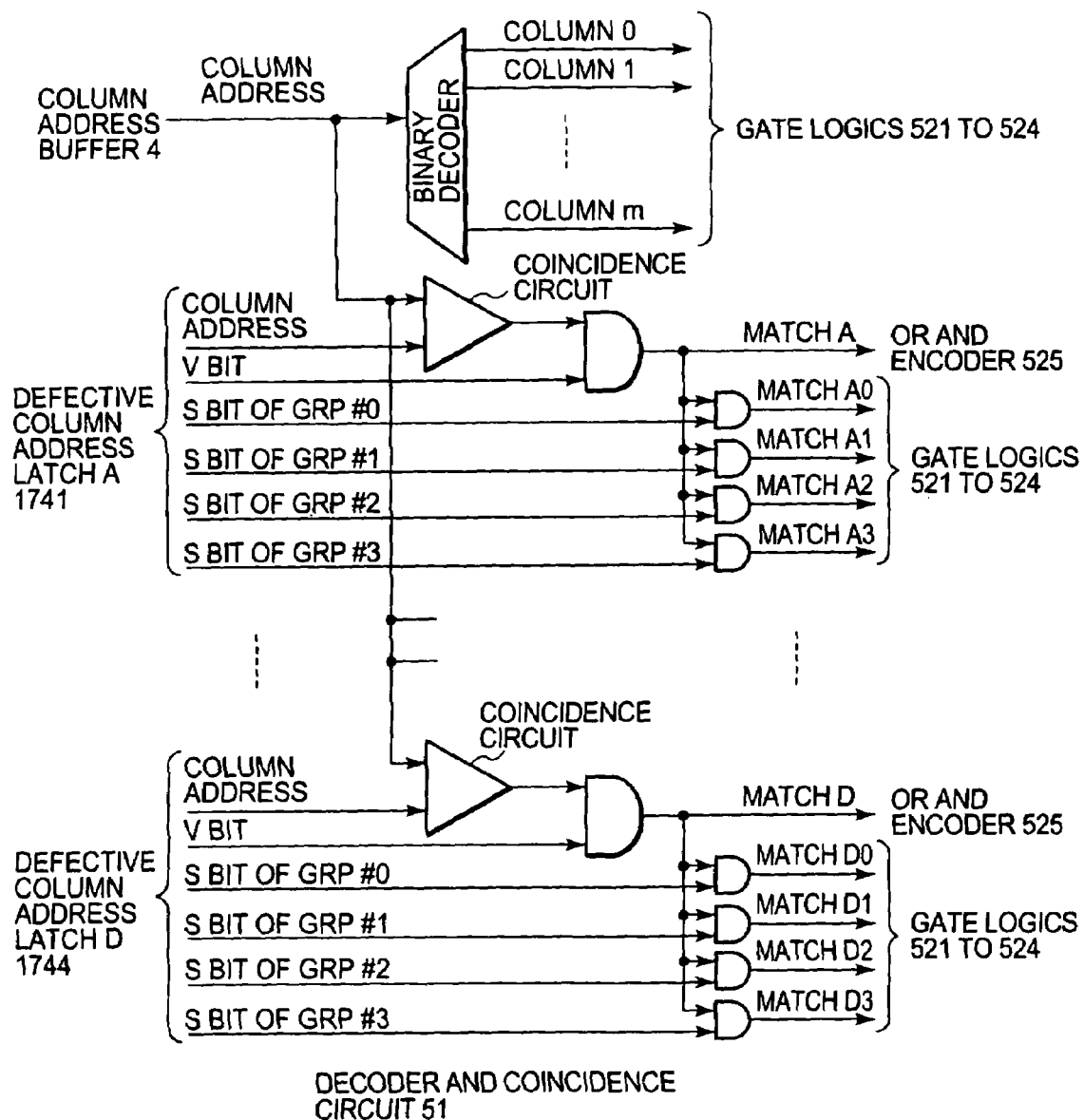
FIG. 14 is an exemplary block diagram of a coincidence circuit.

FIG. 14 shows an exemplary configuration of the decoder and coincidence circuit 51. The decoder and coincidence circuit 51 includes one binary decoder (unreferenced in FIG. 14) which decodes the column address (e.g., 10-bit) of the column address buffer 4 and four coincidence circuits which check whether the column address of the defective column address latch A 1741 to the defective column address latch D 1744 matches an address of the column address buffer 4.

The output of the column 0 to column m (m indicates the last number of the cell column, e.g., 1023) is a binary decoded output of a 10-bit column address of the column address buffer 4. The output of the match A to match D is an output obtained by ANDing (logical conjunction) the output of the coincidence circuit and the V bits of each of the defective address latches A to D.

The match A0 output is an output obtained by ANDing the match A output and the S bit output of the bit GRP #0 of the defective column address latch A 1741. The match D0 output is an output obtained by ANDing the match D output and the S bit output of the bit GRP #0 of the defective column address latch D 1744.

Figure 15:
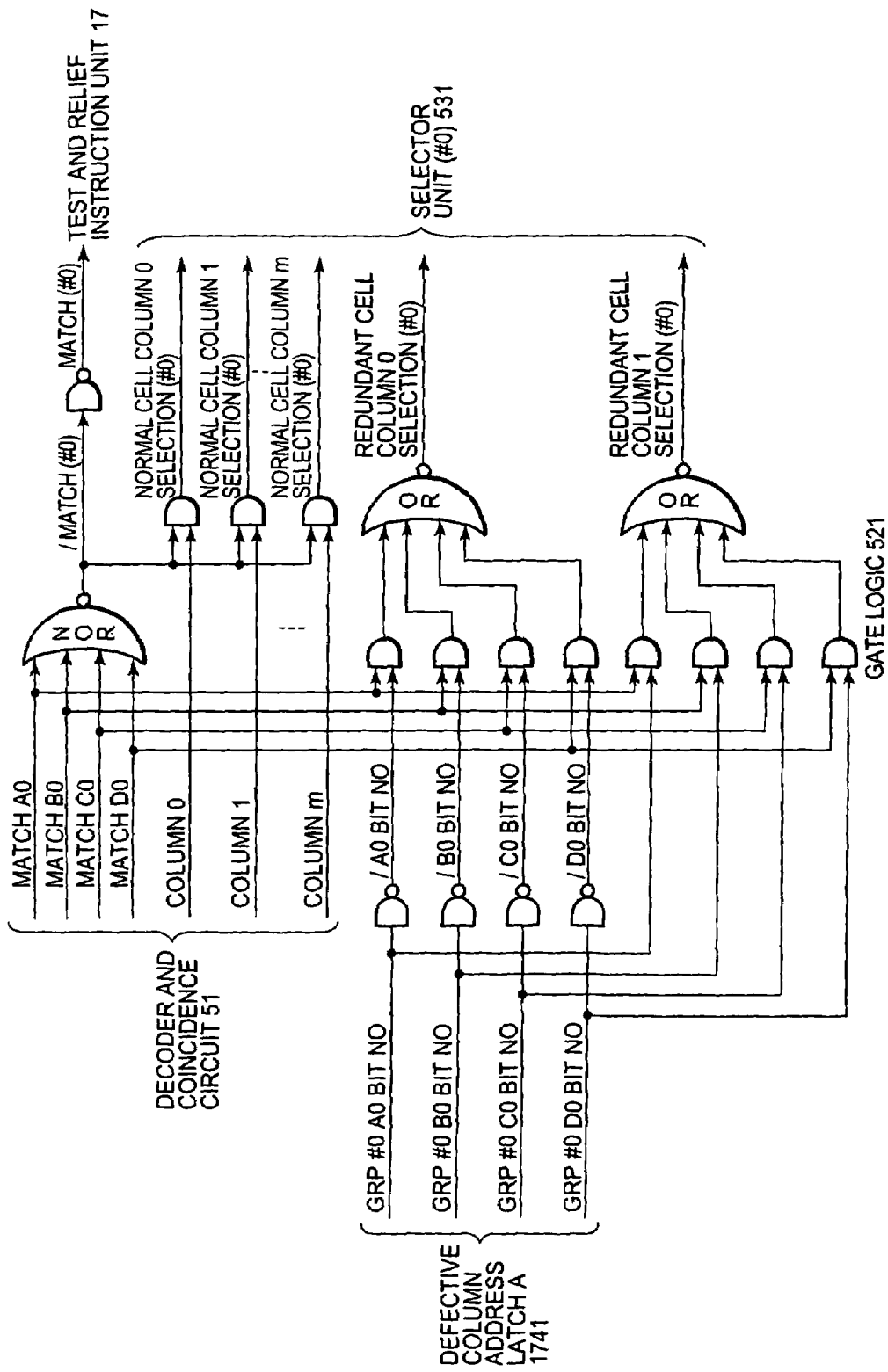
FIG. 15 is an exemplary block diagram of a gate logic circuit.

FIG. 15 shows an exemplary configuration of the gate logic 521. The gate logic 521 generates an output for the bit GRP #0. The /match (#0) is a NORed output of the match A0, the match B0, . . . , the match D0. In other words, the /match (#0) is a signal which becomes "1" if there is no defective column address information indicating that the column addresses are matched and the S bit of the bit GRP #0 is "1".

The signal obtained by ANDing the outputs of each of the column 0 to column m and the /match (#0) is a signal of the cell column 0 selection (#0) to the cell column (#m) selection, respectively.

The redundant cell column 0 selection (#0) signal is an output by ORing (logical inclusion) the four ANDed outputs: AND of the match A0 and the /A0 bit No (complement of the bit No of the bit GRP #0 of the defective column address latch A 1741), AND of the match B0 and the /B0 bit No, . . . , AND of the match D0 and the /D0 bit No.

The redundant cell column 1 selection (#0) signal is an output by ORing the four ANDed outputs: AND of the match A0 and the A0 bit No (the bit No of the bit GRP #0 of the defective column address latch A 1741), . . . , AND of the match D0 and the D0 bit No.

The OR and encoder 525 outputs a latch No (number) signal by ORing the output of the match A output to the match D output and encoding the match A output to the match D output into 2-bit. The match ORed output becomes "1" if any one of the defective column address latch A 1741 are sent to the defective column address buffer 4. The latch No signal indicates the defective column address latch numbers matched at that time (A to D corresponding to "0" to "3").

Figure 10:
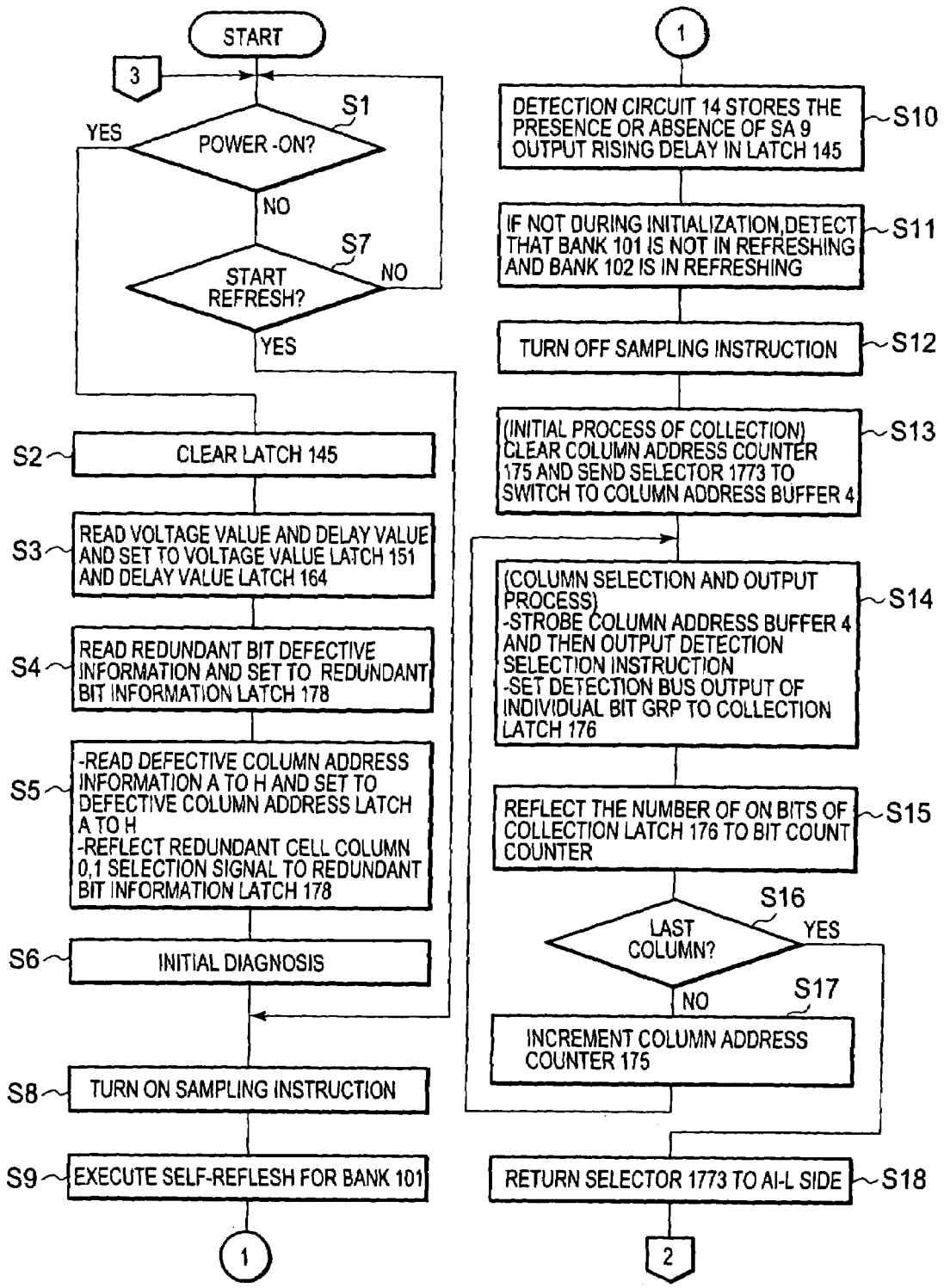
FIG. 10 is an exemplary flow chart of the present invention.

Next, an exemplary operation of the first exemplary embodiment will be described. FIG. 10 is an exemplary flowchart showing the exemplary operation.

When the control unit 170 receives a power-on signal from the main control unit 19 (Step S1, "Yes"), the control unit 170 activates the clear instruction to the repeater 168 and clears the latch 145 (Step S2). The control unit 170 reads the voltage value and the delay value from the nonvolatile storage unit 171 and sets the values to the voltage value latch 151 and the delay value latch 164, respectively (Step S3). The control unit 170 reads redundant bit defective information from the nonvolatile storage unit 171 and sets the information to the redundant bit information latch 178 (Step S4).

The control unit 170 reads the defective column address information A to H and sets the information to the defective column address latch A 1741 to the defective column address latch H 1748, and sets the redundant cell column 0-1 selection signal to the redundant bit information latch 178. In other words, the control unit 170 sets to "1" the bit corresponding to the allocated redundant cell column of the bits of the redundant bit information latch 178 (Step S5).

The control unit 170 performs an initial diagnosis at power-on of the memory device 100 (Step S6). However, it is assumed that the failure is not detected in this explanation of the exemplary operation of the first exemplary embodiment.

When the initial diagnosis is finished, the control unit 170 turns on the sampling instruction to the timing generator circuit 16 (Step S8). When the power-on signal is not received from the main control unit 19 (Step S1, "No"), the control unit 170 waits for a refresh start signal (Step S2, "Yes"), and then goes to Step S8.

The main control unit 19 executes self-refresh for the bank 101 (Step S9). Each time the main control unit 19 executes the self-refresh for each word of the bank 101, the word line enable signal is outputted to the timing pulse generator circuit 161. Then, the first timing signal Φ1 and the second timing signal Φ2 are outputted from the repeaters 166 and 167. The detection circuit 14 of the bank 101 stores information in the latch 145, the information indicates whether the output of the SA 9 is delayed or not (Step S10).

If the initialization is not performed, then the control unit 170 detects that the bank 101 is not being refreshed and the bank 102 is being refreshed (Step S11), and then turns off the sampling instruction (Step S12). The control unit 170 performs an initial process of collection of the sign of failure detected by the sign detection unit 13. That is, the control unit 170 clears the column address counter 175, instructs the selector 1773 to select the column address counter 175 and sends the selected signal to the column address buffer 4 (Step S13).

The control unit 170 strobes the value of the column address counter 175 in the column address buffer 4 and then outputs the detection selection instruction to the column selector unit 5. Then, the control unit 170 sets the value of the detection bus 59 of each of the bit GRP to the collection latch 176 (Step S14).

The control unit 170 sets the number of "ON" state bits of the collection latch 176 to a bit count counter 179 (shown in FIG. 7) (Step S15).

If the column address counter 175 does not indicate the last column (Step S16, "No"), then the control unit 170 increments the column address counter 175 (Step S17) and repeats the process of step S14 and the process thereafter.

If the last column is determined in step S16 (Step S16, "Yes"), then the control unit 170 instructs the selector 1773 to select the "AI-L".

Figure 11:
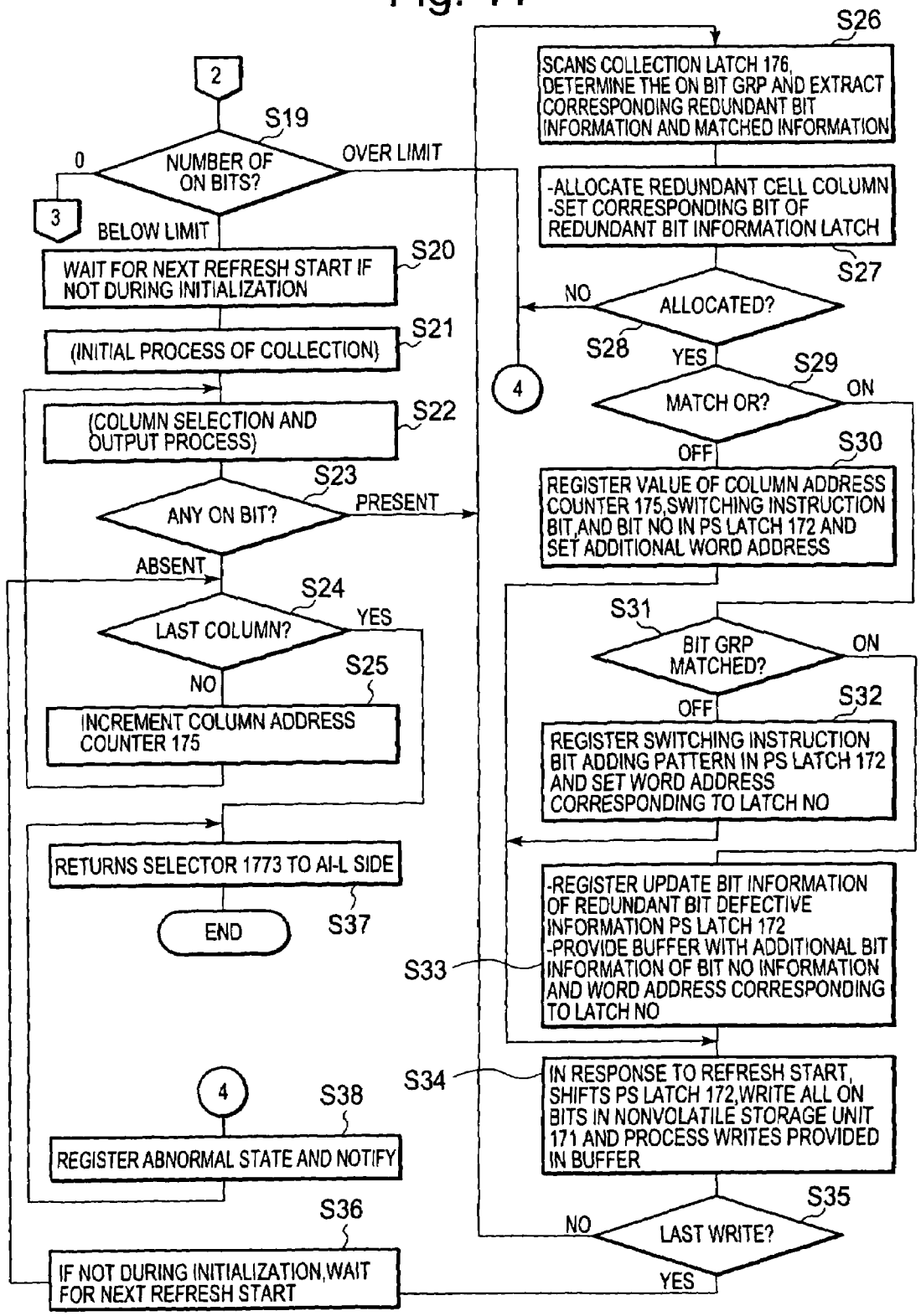
FIG. 11 is an exemplary flow chart of the present invention.

As shown in FIG. 11, if the number of "ON" state bits is "0", then the control unit 170 returns to step S1. If the number of "ON" state bits exceeds the limit (step S19, "over limit"), then the control unit 170 registers an abnormal state in a state register or the like (Step S38).

If the number of "ON" state bits exceeds the limit, then the cell columns which show the sign of failure are not switched to the redundant cell column since the number of the redundant cell columns may be not enough to compensate for the sign of failure and since it is supposed that there may be another source (e.g., noise) which causes the sign of failure (i.e., the delay of the output of the SA 9). The other source, e.g., the noise, may occur, for example, when a human unintentionally touches a terminal of the memory device 100 etc.

If the number of "ON" state bits is one or more but is no more than the limit (Step S19, "below limit"), and if it is not during the initialization of the memory device 100, then the control unit 170 waits for the next refresh start (Step S20), and then performs the initial process of collection similarly as in step S13 (Step S21).

The control unit 170 performs the column selection and output process similarly as in step S14 (Step S22). If there is no "ON" state bit in the collection latch 176 (Step S23, absent), and if it is not the last column (Step S24, "No"), then the control unit 170 increments the column address counter 175 (Step S25), and repeats the process in step S22 and thereafter.

If there is the "ON" state bit in the collection latch 176 (Step S23, "present"), then the control unit 170 scans the collection latch 176, determines which bit GRP corresponds to the "ON" state bit, and extracts the corresponding redundant bit information and the matched information (Step S26).

The control unit 170 allocates the available redundant cell column of the bit GRP corresponding to the "ON" state bit of the collection latch 176 of the cell column which is currently read. The available redundant cell column means that the redundant cell column corresponds to the "0" state bit of the redundant bit information latch 178. The control unit 170 sets the "0" state bit of the redundant bit information latch 178 to "1" (Step S27). The "1" state bit of the redundant bit information latch 178 means that the redundant cell column corresponding to the "1" state bit is not available for allocation.

If the allocation of the redundant cell column succeeds (Step S28, "Yes"), and if a match OR signal (shown in FIG. 9) is off (Step S29, "off"), then the control unit 170 adds a new piece of defective column address information. The control unit 170 registers a value of the column address counter 175, a switching instruction bit, and the bit No in the PS latch 172 and sets the additional word address. The additional word address is set, for example, by sequentially reading defective column address information in step 55 and holding a word address with the V bit being off.

If the match OR signal is "ON" state (Step S29, "ON") and the bit GRP is not matched (Step S31, "OFF"), then the control unit 170 registers the S bit and the bit No to the PS latch 172, and sets the word address corresponding to the latch No (Step S32).

If the bit GRP is matched (Step S31, "ON"), then it means that the redundant cell column is defective. The control unit 170 registers the update bit information of the redundant bit defective information in the PS latch 172 and sets the word address to "1". The control unit 170 provides a buffer register with an additional bit information of bit No. information for bit No. change (writing "1") and a word address corresponding to the latch No. (Step S33).

In response to a long-period refresh start signal, the control unit 170 shifts the PS latch 172, and writes all "ON" state bits into the nonvolatile storage unit 171 and processes with provided in the column address buffer 4. A plurality of bit writes are performed each time when each of a plurality of the long-period refresh start signals is received (Step S34).

If it is not the last write of the cell column being processed (Step S35 "No"), then the control unit 170 repeats the process in step S26 and thereafter. If it is the last write (Step S35, "Yes"), and if it is not during the initialization of the memory device 100, then the control unit 170 instructs the selector 1773 to select the "AI-L", and waits for the next refresh (Step S36), and repeats the processes in step S24 and thereafter.

After the control unit 170 repeats the process of step S24 several times, and if the last column is reached (Step S24, "Yes"), then the control unit 170 instructs the selector 1773 to select (e.g., return to) the "AI-L" (Step S37), and terminates the process related to detection of the sign of failure. The control unit 170 turns on an initialization wait flag and suppresses the process related to detection of a characteristic defect until the defective column address information is read and set during the initialization of the memory device 100.

According to the memory device 100 of the first exemplary embodiment, when the relief instruction unit 17 collects the result indicating the presence of the sign of failure from the detection circuit 14, the relief instruction unit 17 switches the cell column which shows the sign of failure to the redundant cell column.

Accordingly, the memory device 100 of the first exemplary embodiment includes an advantage of preventing the defect from occurring and maintaining the reliability of the memory device 100.

Since the collection of the detection result of the sign detection unit 13 is performed during the refresh, the collection process does not affect to the normal operation of the memory device 100.

Since the reference voltage is adjustable by the reference voltage generator circuit 15, an accuracy of the detection of the sign of failure may be improved.

Since the switching instruction bit is allocated to each of the bit GRP, the number of the defective column address information may be reduced, and the number of the defective address latches and the coincidence circuits of the decoder and coincidence circuit 51 may be reduced. In other words, when the sign of failure is simultaneously detected in both of the cell column (i) of the bit GRP #0 of the bank 101 and the cell column (i) of the bit GRP #1 of the bank 101, for example, these signs of failure are stored in one defective column address information.

Since the value of the column address counter and the value of the "AI-L" are selectively transmitted to the column address buffer 4 by the selectors 1773 or 1774, the number of gates may be reduced. Since the selection signal of the cell column or the redundant cell column is commonly used for selecting the detection result of the sign detection circuit 13, the number of gates may be reduced.

When the memory device 100 is an SRAM, the process of collecting the detection result and the process of storing the detection result to the nonvolatile storage unit 171 are performed during the initialization of the memory device 100 since the SRAM does not perform the refresh operation.

2. Second Exemplary Embodiment

In the first exemplary embodiment, the relief instruction unit 17 performs switching of the cell column, which shows the sign of failure, to the redundant cell column automatically without notice. In a second exemplary embodiment, the relief instruction unit 17 does not perform switching automatically without notice.

Instead, the relief instruction unit 17 sends an alarm to outside of the memory device 100 before performing the switching process. Then, when the relief instruction unit 17 receives a write enable command from the outside, the relief instruction unit 17 performs switching of the cell column which shows the sign of failure, to the redundant cell column.

To switch from the cell column showing failure to the redundant cell column may take time. Thus, in the second exemplary embodiment, the write enable command is sent from the outside at a timing for stopping an operation of the memory device 100. Therefore, in the second exemplary embodiment, the relief instruction unit 17 includes a buffer register for holding the address of the cell column required to be switched.

Next, an exemplary operation of the second exemplary embodiment will be described. The exemplary operation of the second exemplary embodiment is shown in FIGS. 10, 12 and 13.

As shown in FIG. 10, the relief instruction unit 17 and the main control unit 19 of the memory device 100 perform the operation of steps S1 to S18 as in the first exemplary embodiment.

Figure 12:
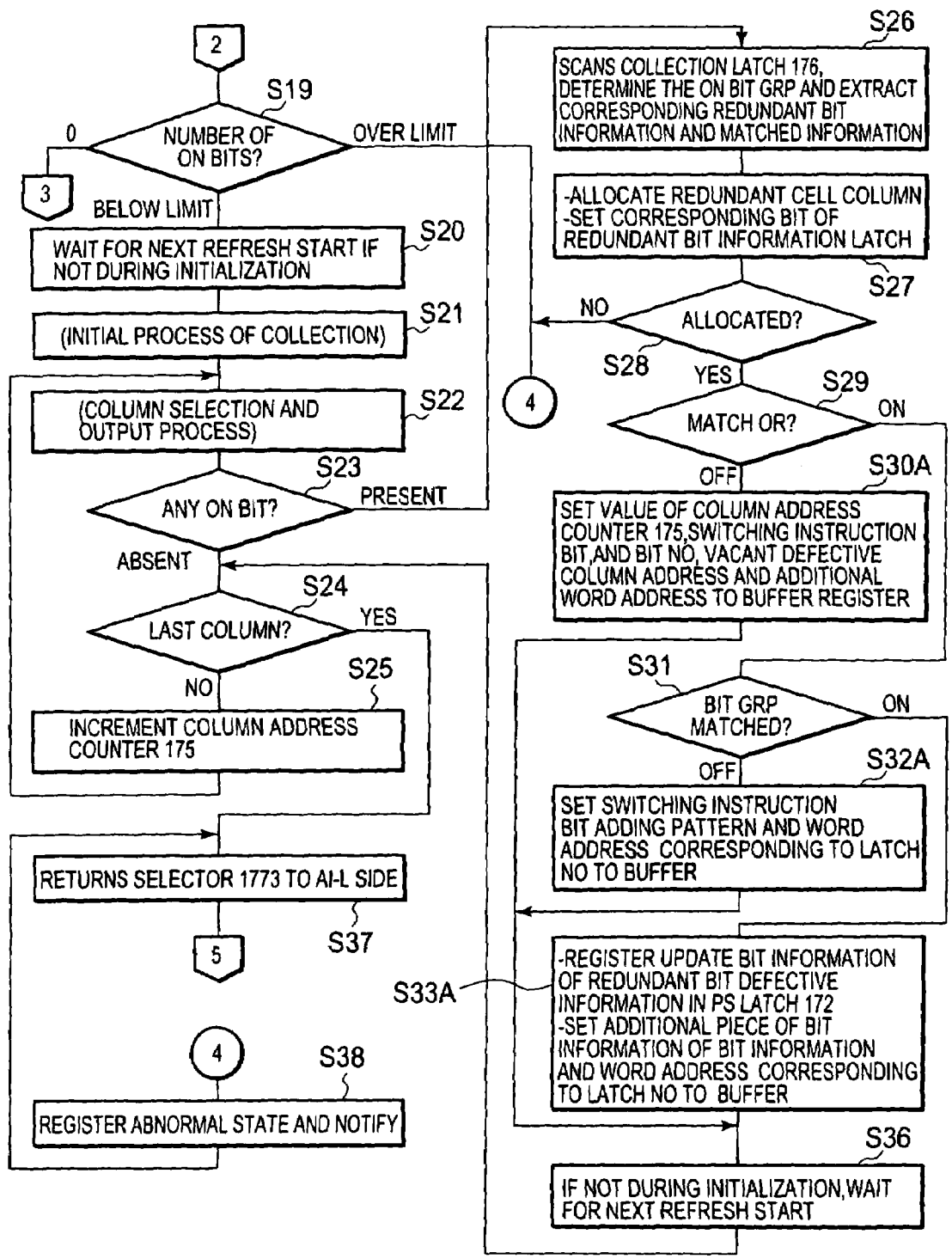
FIG. 12 is an exemplary flow chart of the present invention.
Figure 13:
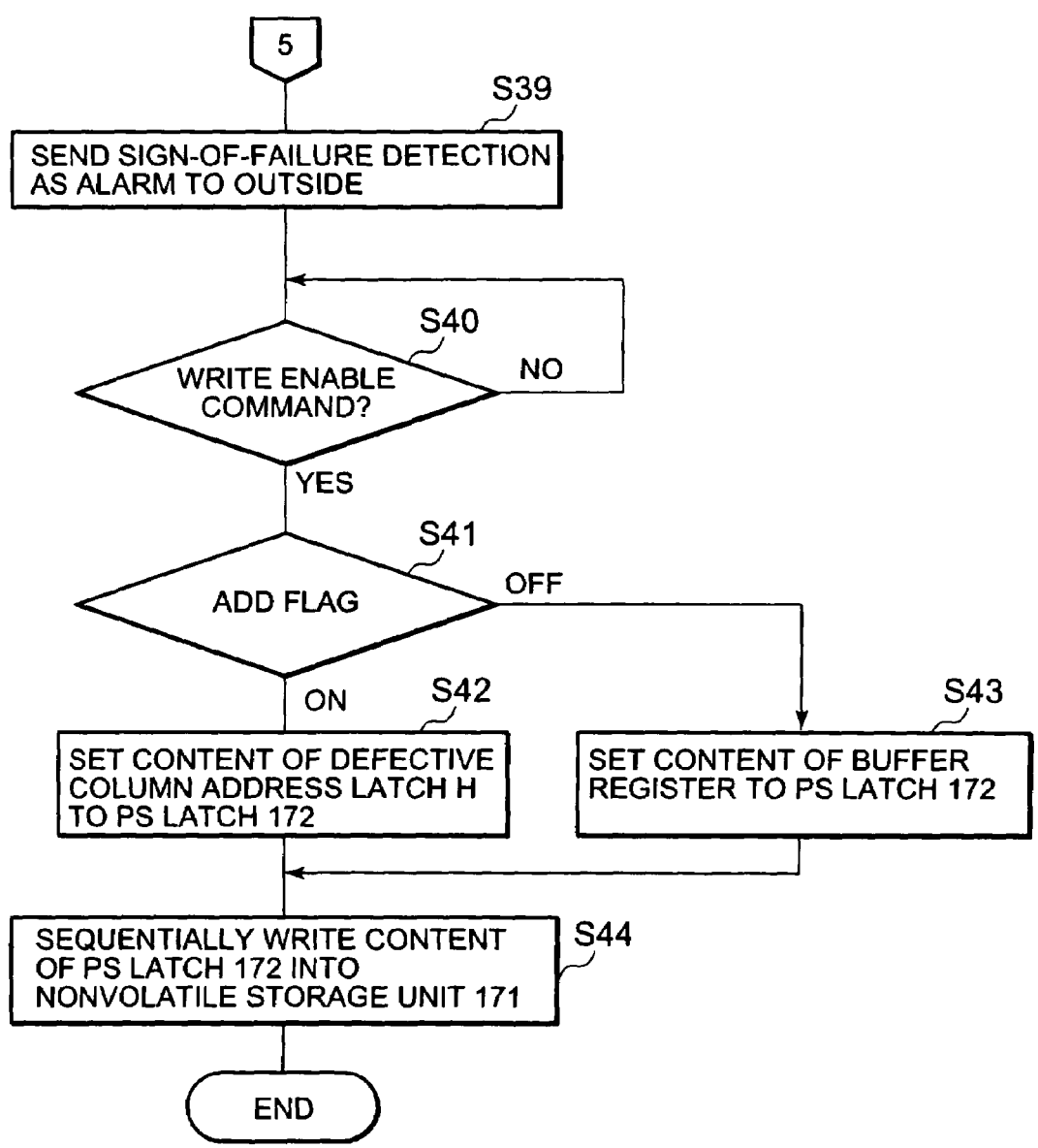
FIG. 13 is an exemplary flow chart of the present invention.

As shown in FIG. 12, the relief instruction unit 17 performs the operation of steps S19 to S28 as in the first exemplary embodiment.

If the match OR signal is "OFF" (step S29, "off"), then the relief instruction unit 17 confirms whether the defective column address latch H 1748 is vacant, temporarily stores the value of the column address counter 175, the switching instruction bit and the bit No in the defective column address latch H 1748, and sets the ADD flag and the additional word address to the buffer register (step S30A).

If the match OR signal is "ON" (step S29, "on"), then the relief instruction unit 17 determines that the change is related to the registered defective column address, and further determines whether the detection of the sign of failure is related to an already allocated redundant cell column or is related to a normal cell column of a new bit GRP of the registered defective column address depending on the ON/OFF of the match signal of an in-process bit GRP.

If the match signal of the in-process bit GRP is "OFF" (step S31, "off"), then the relief instruction unit 17 sets the switching instruction bit adding pattern and the word address corresponding to the latch No. signal to the buffer register (step S32A).

If the match signal of the in-process bit GRP is "ON" (step S31, "on"), then the relief instruction unit 17 registers the bit information to be updated of the redundant bit defective information in the PS latch 172 and sets an additional piece of bit information of the bit No. information and the word address corresponding to the latch No. to the buffer register (step S33A).

If it is not during the initialization of the memory device 100, then the relief instruction unit 17 waits for the next refresh start (step S36), and if it is not the last column (e.g., #1023) (step S24, "No"), the repeats the steps S25, S22, and S23. If the last column is reached (step S24, "Yes"), then the relief instruction unit 17 instructs the selector 1773 to select the "AI-L".

As shown in FIG. 13, the relief instruction unit 17 sends the detection result of the sign of failure as an alarm to the outside of the memory device 100 (step S39). The relief instruction unit 17 waits for the write enable command (step S40, "Yes"), and starts the write process when the write enable command is sent.

If the ADD flag is "ON" (step S41, "on"), then the relief instruction unit 17 sets the content of the defective column address latch H 1748 to the PS latch 172 (step S42). If the ADDflag is "OFF" (step S41, "off"), then the relief instruction unit 17 sets the write data of the buffer register to the PS latch 172 (step S43).

The relief instruction unit 17 sequentially shifts the content of the PS latch 172 and at the same time increments the write address (bit address) to the nonvolatile storage unit 171. If the first bit is "1", then the relief instruction unit 17 writes the address into the nonvolatile storage unit 171 (step S44)

When the step S44 is done, the relief instruction unit 17 terminates the process related to the detection of the sign of failure. The relief instruction unit 17 turns on an initialization wait flag, and suppresses the process related to the characteristic defect detection until the defective column address information is read and set by the initialization process such as power-on of the memory device 100.

The second exemplary embodiment includes advantages similar to the first exemplary embodiment. In addition, the second exemplary embodiment includes an advantage that the second exemplary embodiment may be applicable to a memory device (e.g., an SRAM) which does not refresh.

The reason is that the detection of the sign of failure is notified to the outside of the memory device, and then after receiving the write enable command, the cell column which shows the sign of failure is switched to the redundant cell column.

According to the above description of the first and second exemplary embodiments, the memory device 100 includes a plurality of banks, but the present invention is not limited to the plurality of banks. Any memory device which includes a plurality of memory blocks, partially selects the plurality of the memory blocks, and performs refreshing may be used.

In the above description, the DRAM is described as an example of the memory device 100, but the memory device 100 of the present invention may be used not only for the DRAM, but also for the SRAM and other memory devices regardless of a configuration of the MC (memory cell).

Further, it is noted that applicant's intent is to encompass equivalents of all claim elements, even if amended later during prosecution.

What is claimed is:

1. An apparatus, comprising:
a memory device,
wherein said memory device comprises:
   a first memory cell column which includes a plurality of first memory cells;
   a second memory cell column which includes a plurality of second memory cells;
   a detector which detects a delay of a memory cell signal outputted from at least one of said first memory cells; and
   a selector which selects said second memory cell column instead of said first memory cell column when said delay exceeds a predetermined criteria.

2. The apparatus according to claim 1, further comprising:
   a relief instruction unit which sends a defective column address corresponding to said first memory cell column to said selector when said delay exceeds said predetermined criteria,
   wherein said selector selects said second memory cell column instead of said first memory cell column according to said defective column address.

3. The apparatus according to claim 1, further comprising:
   a relief instruction unit which stores a defective column address corresponding to said first memory cell column to a defective column address storage unit when said delay exceeds said predetermined criteria, and sends said defective column address read from said defective column address storage unit to said selector when said first memory cell column and said second memory cell column are initialized,
   wherein said selector selects said second memory cell column instead of said first memory cell column according to said defective column address.

4. The apparatus according to claim 1, wherein said detector detects said delay according to a duration until a voltage level of said memory cell signal exceeds a reference voltage level.

5. The apparatus according to claim 1, wherein said detector detects said delay according to a voltage difference between a first voltage of said memory cell signal at a first timing and a second voltage of said memory cell signal at a second timing, said second timing being delayed by a predetermined delay time from said first timing.

6. The apparatus according to claim 1, wherein said detector comprises:
   a comparator which compares a reference voltage and a voltage of said memory cell signal;
   a first latch circuit which latches a comparison result signal at a first timing;
   a detection circuit which detects a difference between said comparison result signal latched by said first latch circuit and said comparison result signal outputted from said comparator after said first timing; and
   a second latch circuit which latches a detection output of said detection circuit at a second timing, said second timing being delayed by a predetermined delay time from said first timing.

7. The apparatus according to claim 2, wherein said relief instruction unit comprises:
   a defective column address storage unit which stores a defective column information including a defective column address of said first memory cell column, said delay of said first memory cell column exceeding said predetermined criteria, and a defective column substitution indication flag which indicates said first memory cell column to be substituted with said second memory cell column, wherein said selector selects said second memory cell column when said defective column address and a column address being accessed match, and when said defective column substitution indication flag indicates a valid value.

8. The apparatus according to claim 2, wherein said relief instruction unit comprises:
   a collection unit which collects a detection result of said detector;
   a controller which generates said defective column address according to said detection result; and
   a defective column address storage unit which stores said defective column address.

9. The apparatus according to claim 8, wherein said controller sends a sampling instruction signal to said detector after an initialization of said memory device,
   wherein said detector operates for detecting said delay upon receiving said sampling instruction signal.

10. The apparatus according to claim 8, wherein said memory device further comprises:
    a plurality of memory blocks each of which includes said first memory cell column and said second memory cell column; and
    a main control unit which refreshes said first and second memory cells included in each of said memory blocks, alternately,
    wherein said collection unit collects said detection result of said detector of at least one of said memory blocks while said main control unit refreshes said first and second memory cells of other memory blocks.

11. The apparatus according to claim 10, wherein said controller counts a number of said detection results indicating said memory cell signal being delayed, and invalidates all of said detection results when said number exceeds a predetermined value.

12. A memory device, comprising:
    a first memory cell column which includes a plurality of first memory cells;
    a second memory cell column which for consistency includes a plurality of second memory cells;
    a detector which detects a delay of a memory cell signal outputted from at least one of said first memory cells; and
    a selector which selects said second memory cell column instead of said first memory cell column when said delay exceeds a predetermined criteria.

13. A method of controlling a memory device, comprising:
    detecting a delay of a memory cell signal which is outputted from at least one of a plurality of first memory cells of a first memory cell column; and
    selecting a second memory cell column which includes a plurality of second memory cells instead of said first memory cell column when said delay exceeds a predetermined criteria.

14. The method according to claim 13, further comprising:
    generating a defective column address corresponding to said first memory cell column when said delay exceeds said predetermined criteria; and
    selecting said second memory cell column instead of said first memory cell column according to said defective column address.

15. The method according to claim 13, further comprising:
    generating a defective column address corresponding to said first memory cell column when said delay exceeds said predetermined criteria;
    storing said defective column address to a defective column address storage unit; and
    selecting said second memory cell column instead of said first memory cell column according to said defective column address.

16. The method according to claim 13, further comprising:
    detecting said delay according to a duration until a voltage level of said memory cell signal exceeds a reference voltage level.

17. The method according to claim 13, further comprising:
    detecting said delay according to a voltage difference between a first voltage of said memory cell signal at a first timing and a second voltage of said memory cell signal at a second timing, said second timing being delayed by a predetermined delay time from said first timing.

18. The method according to claim 13, further comprising:
    comparing a reference voltage and a voltage of said memory cell signal;
    generating a comparison result signal according to said comparing;
    latching said comparison result signal at a first timing;
    detecting a difference between said comparison result and said comparison result generated after said first timing;
    generating a detection output according to said detecting; and
    latching said detection output at a second timing, said second timing being delayed by a predetermined delay time from said first timing.

19. The method according to claim 13, further comprising:
    storing a defective column information in a defective column address storage unit, when said delay of said first memory cell column exceeds said predetermined criteria, said defective column information including a defective column address of said first memory cell column, and providing a defective column substitution indication flag which indicates said first memory cell column to be substituted with said second memory cell column;
    selecting said second memory cell column when said defective column address and a column address being accessed match, and when said defective column substitution indication flag indicates a valid value.

20. The method according to claim 14, further comprising:
    collecting a detection result, said detection result corresponding to said delay of said memory cell signal;
    generating said defective column address according to said detection result; and
    storing said defective column address in a defective column address storage unit.

21. The method according to claim 20, further comprising:
    generating a sampling instruction signal after initialization of said memory device; and
    detecting said delay according to said sampling instruction signal.

22. The method according to claim 21, wherein said memory device comprises a plurality of memory blocks each of which includes said first memory cell column and said second memory cell column, further comprising:
  refreshing said first and second memory cells included in each of said memory blocks, alternately; and
  collecting said detection result of at least one of said memory blocks while said first and second memory cells of other memory blocks are refreshed.

23. The method according to claim 22, further comprising:
  counting a number of said detection results indicating said memory cell signal being delayed; and
  invalidating all of said detection results when said number exceeds a predetermined value.

* * * * *